(12) United States Patent
Kiewra et al.

(10) Patent No.: US 7,964,896 B2
(45) Date of Patent: Jun. 21, 2011

(54) BURIED CHANNEL MOSFET USING III-V COMPOUND SEMICONDUCTORS AND HIGH K GATE DIELECTRICS

(75) Inventors: Edward W. Kiewra, Verbank, NY (US); Steven J. Koester, Ossining, NY (US); Devendra K. Sadana, Pleasantville, NY (US); Ghavam Shahidi, Pound Ridge, NY (US); Yanning Sun, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 225 days.

(21) Appl. No.: 12/180,927

(22) Filed: Jul. 28, 2008

(65) Prior Publication Data

US 2008/0296622 A1 Dec. 4, 2008

Related U.S. Application Data

(63) Continuation of application No. 11/767,188, filed on Jun. 22, 2007, now abandoned.

(51) Int. Cl.
*H01L 29/66* (2006.01)
(52) U.S. Cl. ......... 257/194; 257/E21.409; 257/E27.061; 438/172; 438/282
(58) Field of Classification Search .................. 257/194, 257/E27.061, E21.409; 438/282, 172
See application file for complete search history.

(56) References Cited

U.S. PATENT DOCUMENTS

| | | | |
|---|---|---|---|
| 6,034,386 A * | 3/2000 | Ando | 257/280 |
| 6,515,316 B1 | 2/2003 | Wojtowicz et al. | |
| 6,521,961 B1 * | 2/2003 | Costa et al. | 257/402 |
| 6,593,603 B1 * | 7/2003 | Kim et al. | 257/194 |
| 6,770,536 B2 | 8/2004 | Wilk et al. | |
| 6,787,826 B1 | 9/2004 | Tserng et al. | |
| 6,797,994 B1 | 9/2004 | Hoke et al. | |
| 7,393,412 B2 * | 7/2008 | Kohiro et al. | 117/104 |
| 2004/0238842 A1 * | 12/2004 | Micovic et al. | 257/192 |
| 2006/0019435 A1 | 1/2006 | Sheppard et al. | |
| 2007/0138565 A1 | 6/2007 | Datta et al. | |

FOREIGN PATENT DOCUMENTS

| CN | 115774 A | 7/1997 |
|---|---|---|
| CN | 1419713 A | 5/2003 |
| WO | WO 2006/070297 | 6/2006 |

OTHER PUBLICATIONS

Extended European search report dated Sep. 14, 2009.

* cited by examiner

*Primary Examiner* — Wael M Fahmy
*Assistant Examiner* — John C Ingham
(74) *Attorney, Agent, or Firm* — Scully, Scott, Murphy & Presser, P.C.; Louis J. Percello, Esq.

(57) ABSTRACT

A semiconductor-containing heterostructure including, from bottom to top, a III-V compound semiconductor buffer layer, a III-V compound semiconductor channel layer, a III-V compound semiconductor barrier layer, and an optional, yet preferred, III-V compound semiconductor cap layer is provided. The barrier layer may be doped, or preferably undoped. The III-V compound semiconductor buffer layer and the III-V compound semiconductor barrier layer are comprised of materials that have a wider band gap than that of the III-V compound semiconductor channel layer. Since wide band gap materials are used for the buffer and barrier layer and a narrow band gap material is used for the channel layer, carriers are confined to the channel layer under certain gate bias range. The inventive heterostructure can be employed as a buried channel structure in a field effect transistor.

29 Claims, 7 Drawing Sheets

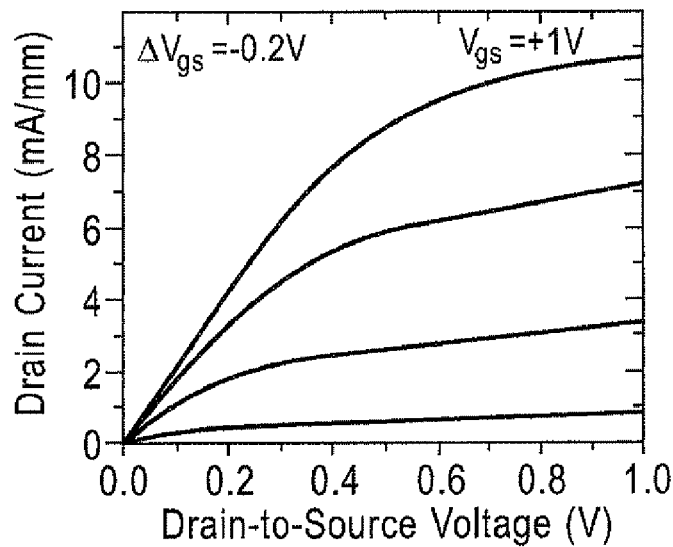
FIG. 5
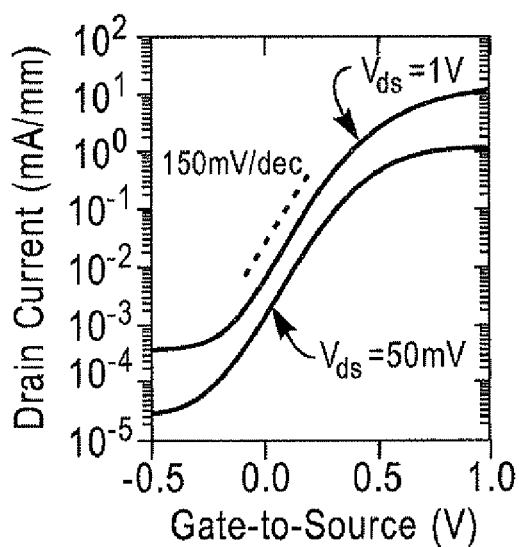 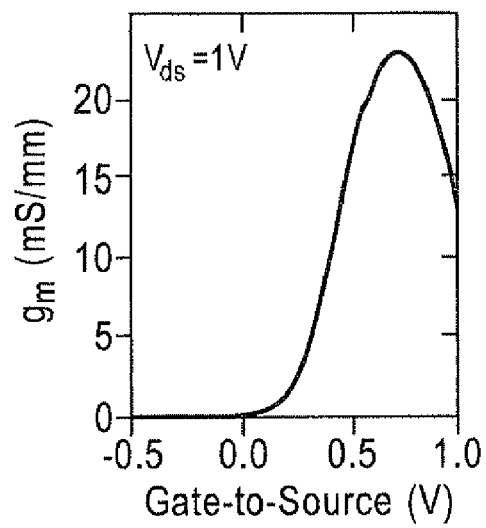
FIG. 6A          FIG. 6B

BURIED CHANNEL MOSFET USING III-V COMPOUND SEMICONDUCTORS AND HIGH K GATE DIELECTRICS

RELATED APPLICATIONS

This application is a continuation of U.S. application Ser. No. 11/767,188, filed Jun. 22, 2007, which claims benefit of U.S. Provisional Application Ser. No. 60/816,050, filed Jun. 23, 2006, the entire contents of which are incorporated herein by reference.

FIELD OF THE INVENTION

The present invention relates to semiconductor structures and methods of fabricating the same. More particularly, the present invention relates to a III-V compound semiconductor-containing heterostructure which can be used as a buried channel of a field effect transistor (FET). The present invention also provides a method of fabricating such a III-V compound semiconductor-containing heterostructure. In addition, the present invention also provides a method of forming a FET which includes the inventive heterostructure as a buried channel.

BACKGROUND OF THE INVENTION

Compound semiconductors are receiving renewed attention for use as channel materials for advanced ultra large scale integration (ULSI) digital logic applications due to their high electron hole mobility. For example, the InGaAs/InAlAs material system is one of the most promising material systems for this application due to its large conduction-band offsets and high carrier mobility. Schottky-gated InGaAs high electron mobility transistors (HEMTs) grown on InP substrates have produced maximum transconductance $g_m$ values over 2 S/mm (see, D. Xu et al., IEEE Elec. Dev. Let., 20, 206 (1999)), and have been shown to compare favorably in terms of a power-delay product (see, D. H. Kim et al., IEDM Tech. Dig., 787, (2005)).

Despite these promising results, for ULSI applications, InGaAs-channel field effect transistors (FETs) will ultimately need to incorporate high dielectric constant (k) dielectrics as the gate dielectric in order to meet current leakage requirements.

Previous work on InGaAs-channel metal oxide semiconductor field effect transistors (MOSFETs) has mainly focused on surface-channel device geometries. See, for example, F. Ren, IEEE. Elec. Dev. Let., 19, 309 (1998). Such devices, however, require the formation of an extremely high quality semiconductor/dielectric interface in order to preserve a low interface state density near the surface-layer conduction band edge.

Despite the above advances in the art, integration of InGaAs-channels for FET applications still requires breakthrough in the following areas (i) surface passivation in conjunction with compatibility with high k gate dielectrics, (ii) quantum well engineering for scalability beyond 22 nm CMOS technology, and (iii) low resistance in the source/drain regions. To date, the applicants are unaware of any prior art III-V compound semiconductor-containing structure that satisfies the three requirements mentioned above.

In view of the above, there exists a need for providing a III-V compound semiconductor-containing heterostructure which can be used as a buried channel for FETs, including MOSFETs.

There also exists a need for providing a III-V compound semiconductor-containing heterostructure which provides (i) surface passivation in conjunction with compatibility with high k gate dielectrics, (ii) quantum well engineering for scalability beyond 22 nm CMOS technology, and (iii) low resistance in the source/drain regions.

SUMMARY OF THE INVENTION

The present invention provides a III-V compound semiconductor-containing heterostructure (i.e., a quantum well structure) which can be used as a buried channel for FETs. The inventive III-V compound semiconductor-containing heterostructure addresses the surface passivation problem mentioned above. In addition, the inventive IIII-V compound semiconductor-containing heterostructure can be scaled beyond the 22 nm CMOS technology. Moreover, the inventive III-V compound semiconductor-containing heterostructure, when present in MOSFET including a selective epitaxial layer in the source/drain regions, can aide in reducing the resistance in the source/drain regions of the FET.

In the present invention, the term "III-V compound semiconductor" denotes a semiconductor material that includes at least one element from Group III of the Periodic Table of Elements and at least one element from Group V of the Periodic Table of Elements. Typically, the III-V compound semiconductors are binary, ternary or quaternary alloys including III/V elements. Examples of III-V compound semiconductors that can be used in the present invention include, but are not limited to alloys of InGaAs, InAlAs, InAlAsSb, InAlAsP and InGaAsP.

The inventive III-V compound semiconductor-containing heterostructure comprises, from bottom to top, a III-V compound semiconductor buffer layer, a III-V compound semiconductor channel layer and a III-V compound semiconductor barrier layer. In the present invention, the barrier layer and the buffer layer are comprised of a III-V semiconductor material that each has a wider band gap than that of the III-V compound semiconductor channel layer. That is, the barrier layer and the buffer layer are each composed of a III-V compound semiconductor having a band gap that is larger than the band gap of the III-V compound semiconductor in the channel layer. The term "band gap" refers to the energy difference between the top of the valence band (i.e., $E_V$) and the bottom of the conduction band (i.e., $E_C$). Typically, the buffer layer also has a wide band gap as compared to the channel layer.

Since a wide band gap material is used for the barrier and buffer layers and a narrow band gap material is used for the channel layer, carriers are confined to the channel layer under certain gate bias range. Typically, the carriers are confined in the channel layer when typical gate bias conditions are applied.

The inventive III-V compound semiconductor-containing heterostructure used for a buried channel MOSFET minimizes the stringent requirements for dielectric/III-V interfacial properties. In contrast and in prior art MOSFET structures including a surface channel III-V structure, a high density of traps at the dielectric/III-V interface exists which prevents the formation of an inversion layer.

In addition, the inventive III-V compound semiconductor-containing heterostructure used for a buried channel MOSFET has a higher carrier mobility compared to conventional surface channel III-V containing MOSFET structure due to a reduction in carrier scattering.

In general terms, the inventive III-V compound semiconductor-containing heterostructure comprises:

a III-V compound semiconductor buffer layer having a first band gap;
a III-V compound semiconductor channel layer having a second band gap located on an upper surface of said buffer layer; and
a III-V compound semiconductor barrier layer having a third band gap located on an upper surface of the III-V compound semiconductor channel layer, wherein said first and third band gaps are larger than the second band gap.

In some embodiments of the present invention, the barrier layer includes a doped region which is located in a lower region of the barrier layer that abuts the interface with the underlying III-V compound semiconductor channel layer; such a doped region is referred to in the art as a delta doped region. When a doped region is present in the barrier layer, the dopant atom may be an n-type dopant (i.e., an element from Group IV or VI of the Periodic Table of Elements) or a p-type dopant (i.e., an element from Group II or VI of the Periodic Table of Elements). The concentration of dopant within the doped region is typically from about $10^{11}$ to about $10^{15}$ atoms/$cm^2$, with a concentration of dopant within the doped region from about $10^{11}$ to about $10^{13}$ atoms/$cm^2$ being more typical.

In yet another embodiment of the present invention, a III-V compound semiconductor cap layer can be located atop the III-V compound semiconductor barrier layer. When the III-V semiconductor cap layer is present, the cap layer is typically, but not always necessarily, a doped layer. The dopant within the III-V compound semiconductor cap layer can be an n-type dopant or a p-type dopant, with an n-type dopant being more typical for an n-MOSFET. Unlike the delta doped region described above, the doping within the cap layer is evenly distributed throughout the entire vertical thickness of the layer. The concentration of dopant with the cap layer is typically from about $10^{17}$ to about $10^{21}$ atoms/$cm^3$, with a concentration of dopant within the cap layer from about $10^{18}$ to about $10^{20}$ atoms/$cm^3$ being more typical.

The cap layer may comprise the same or different III-V compound semiconductor as the channel layer. In a preferred embodiment of the present invention, the cap layer and the channel layer comprise the same material elements, but are of a different alloy composition.

In still another embodiment of the present invention, the barrier layer and the buffer layer are comprised of an alloy of InAlAs, while the channel layer is comprised of an alloy of InGaAs. By "alloy of InAlAs" it is meant a composition of $In_xAl_{1-x}As$ wherein x is from about 0 to about 1, and more preferably from about 0.4 to about 0.6. In one highly preferred embodiment of the present x is 0.52. By "alloy of InGaAs" it is meant a composition of $In_yGa_{1-y}As$ wherein y is from about 0 to about 1, and more preferably y is from about 0.3 to about 0.8. In a highly preferred embodiment of the present invention, y is 0.7.

In a further embodiment of the present invention, each of the III-V compound semiconductor layers is a single crystal material of typical commercial quality. By "typical commercial quality" it is meant that each of the III-V compound semiconductor layers have a defect density on the order of about $10^5$ atoms/$cm^2$ or less, with a defect density of less than about 5000 atoms/$cm^2$ being more typical. The typical commercial quality of the III-V compound semiconductor layers is a result of utilizing an epitaxial growth process such as, for example, molecular beam epitaxy (MBE) or metalorgano chemical vapor deposition (MOCVD).

In addition to the above III-V compound semiconductor-containing heterostructure, the present invention also is directed to structures, such as, for example FETs, that contain the inventive III-V compound semiconductor-containing heterostructure as a buried channel. In this aspect of the present invention, the semiconductor structure includes:
a semiconductor substrate having an upper surface;
a buried channel structure located on said upper surface of said semiconductor substrate, wherein said buried channel structure comprises a III-V compound semiconductor buffer layer having a first band gap, a III-V compound semiconductor channel layer having a second band gap located on an upper surface of said buffer layer, and a III-V compound semiconductor barrier layer having a third band gap located on an upper surface of the III-V compound semiconductor channel, wherein said first and third band gaps are larger than the second band gap;
a dielectric material having a dielectric constant of greater than 4.0 located on said buried channel structure and in contact with at least a portion of said barrier layer;
a gate conductor located on a portion of said dielectric material; and
a source contact and a drain contact which are in contact with at least said channel layer.

Most of the embodiments mentioned above for the heterostructure apply here as well for the FET-containing structure as well.

It is noted that in the inventive FET structure, the cap layer mentioned above is a patterned III-V compound semiconductor cap layer that, if present, is located atop the III-V compound semiconductor barrier layer. In embodiments in which the patterned cap layer is present, the patterned cap layer has an opening that extends to a surface of the underlying barrier layer. The dielectric material is present in the exposed barrier layer. In some embodiments, the dielectric material is present on the surface of the patterned cap layer as well as within the opening covering the exposed sidewalls of the patterned cap layer and the exposed bottom portion of the barrier layer. In the embodiment including the patterned cap, the width of the opening defines the gate length. In one embodiment, the channel length is less than or equal to 260 nm. In some embodiments, the structure has a positive threshold voltage.

The dielectric material having a dielectric constant of greater than 4.0 is referred to herein as a high k dielectric. Typically, the high k dielectric has a dielectric constant of about 7.0 or greater, with a dielectric constant of about 10.0 or greater being even more typical. The dielectric constants mentioned herein are relative to a vacuum, unless otherwise stated. Specifically, the high k dielectric employed in the present invention includes, but is not limited to an oxide, nitride, oxynitride and/or silicates including metal silicates, aluminates, titanates and nitrides. In one embodiment, it is preferred that the high k dielectric is comprised of $HfO_2$, $ZrO_2$, $Al_2O_3$, $TiO_2$, $La_2O_3$, $SrTiO_3$, $LaAlO_3$, $Y_2O_3$, a pervoskite oxide, $HfSiO_z$, $HfAlO_z$ or $HfAlO_aN_b$. Preferably, the high k dielectric is a Hf-based dielectric material.

The gate conductor of the present invention includes any conductive material such as, for example, polysilicon, polysilicon germanium, conductive metals, conductive metal alloys, conductive silicides, conductive nitrides and combinations or multilayers thereof. Preferably, the gate conductor is a conductive metal, with Al, Pt, Au, W and Ti being highly preferred. The selection of metal gates is advantageous since conductive metals have different workfunctions that permit one to adjust the threshold voltage of the device.

The source and drain contacts, which are on either side of the gate conductor, are typically comprised of a conductive material including one of the conductive materials mentioned above for the gate conductor.

In some embodiments of the present invention, the barrier may include a thin passivation layer. When present, the thin passivation layer may comprise a thin layer of a chemical oxide. Alternatively, the passivation layer may include a thin layer of amorphous $Si/SiO_2$ or $Ge/Si/SiO_2$.

In addition to the above structures, the present invention also relates to a method of fabricating such structures. With respect to the inventive III-V compound semiconductor-containing heterostructure, the method includes:

first epitaxially growing a III-V compound semiconductor buffer layer having a first band gap on an upper surface of a substrate;

second epitaxially growing a III-V compound semiconductor channel layer having a second band gap on an upper surface of the buffer layer; and third epitaxially growing a III-V compound semiconductor barrier layer having a third band gap on an upper surface of the III-V compound semiconductor channel layer, wherein said first and third band gaps are larger than the second band gap.

The substrate may also be a semiconductor substrate or a material stack comprising at least a semiconductor substrate. In other embodiments, a fourth step of epitaxially growing is performed that forms a III-V compound semiconductor cap layer on the surface of the barrier layer.

With respect to the inventive FET, the method includes the steps of:

forming a buried channel structure atop a semiconductor substrate, wherein said forming includes first epitaxially growing a III-V compound semiconductor buffer layer having a first band gap on an upper surface of said semiconductor substrate, second epitaxially growing a III-V compound semiconductor channel layer having a second band gap on an upper surface of the buffer layer, and third epitaxially growing a III-V compound semiconductor barrier layer having a third band gap on an upper surface of the III-V compound semiconductor channel layer, wherein said first and third band gaps are larger than the second band gap;

forming a dielectric material having a dielectric constant of greater than 4.0 on said buried channel structure and in contact with at least a portion of said barrier layer;

forming a gate conductor on a portion of said dielectric material; and forming a source contact and a drain contact which are in contact with at least said channel layer.

Many of the above-mentioned embodiments are also applicable in forming the inventive FET structure.

BRIEF DESCRIPTION OF THE DRAWINGS

FIG. 5 is a plot of drain current (mAmps/mm) vs. drain-to-source voltage (V) of a long channel MOSFET with $L_g$=5 microns.

FIGS. 6A-6B are plots of the drain current (mAmps/mm) vs. gate-to-source (V) and extrinsic transconductance $g_m$ (mS/mm) vs. gate-to-source (V), respectively, of a long channel MOSFET with $L_g$=5 microns.

DETAILED DESCRIPTION OF THE INVENTION

Figure 1:
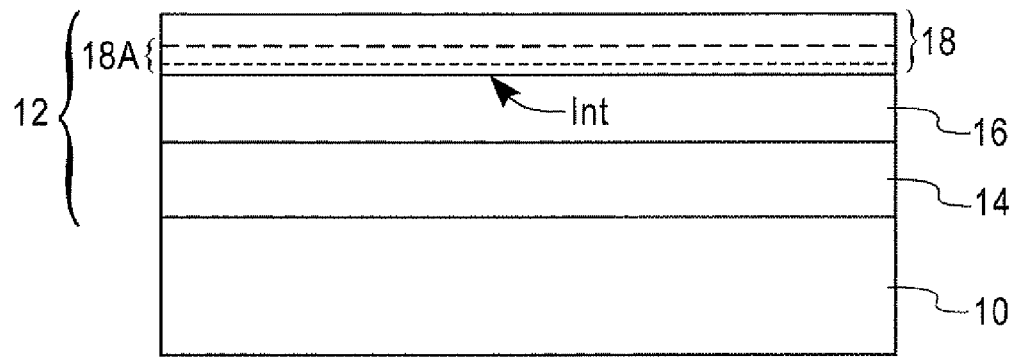
FIG. 1 is a pictorial representations (through a cross sectional view) illustrating a heterostructure of the present invention which is suitable for use in a buried channel MOSFET.

The present invention, which provides a heterostructure including a III-V semiconductor barrier layer and a III-V compound semiconductor channel layer, FETs including the heterostructure as a buried channel structure and methods of fabricating such structures, will now be described in greater detail by referring to the following description and drawings that accompany the present application. It is noted that the drawings of the present application are provided for illustrative purposes only and, as such, the drawings are not drawn to scale. It is also noted that in the drawings like reference numerals are used in describing like materials.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above, the present invention provides a III-V compound semiconductor-containing heterostructure that includes a III-V compound semiconductor buffer layer having a first band gap, a III-V compound semiconductor channel layer having a second band gap located on an upper surface of the buffer layer, and a III-V compound semiconductor barrier layer having a third band gap located on an upper surface of the III-V compound semiconductor channel layer, wherein said first and third band gaps are larger than the second band gap. An optional, yet preferred, III-V compound semiconductor cap layer can be present atop the barrier layer. When present, the optional cap layer is typically doped, preferably with an n-type dopant for an n-MOSFET.

In the present invention, the term "III-V compound semiconductor" denotes a semiconductor material that includes at least one element from Group III of the Periodic Table of Elements and at least one element from Group V of the Periodic Table of Elements. Typically, each of the III-V compound semiconductor layers is a binary, ternary or quaternary III-V containing compound. Examples of III-V compound semiconductors that can be used in the present invention include, but are not limited to alloys of InGaAs, InAlAs, InAlAsSb, InAlAsP and InGaAsP.

Reference is first made to FIG. 1 which illustrates the inventive III-V compound semiconductor-containing heterostructure 12 in accordance with a first embodiment of the present invention formed atop a surface of a semiconductor substrate 10. The inventive heterostructure 12 shown in FIG. 1 includes a III-V compound semiconductor buffer layer 14 having a first band gap, a III-V compound semiconductor channel layer 16 having a second band gap located on an upper surface of the III-V compound semiconductor buffer layer, and a III-V compound semiconductor barrier layer 18 having a third band gap located on an upper surface of the III-V compound semiconductor barrier layer 16.

In the embodiment illustrated, the barrier layer 18 includes a delta doped region 18A that is located in a lower region of barrier layer 18 abutting next to, but not in direct contact with, the interface (INT) with the underlying channel layer 16. The dopant atom present in the delta doped region 18A may be an n-type dopant (i.e., an element from Group IV or VI of the Periodic Table of Elements) or a p-type dopant (i.e., an element from Group II or IV of the Periodic Table of Elements). The concentration of dopant within the delta doped region 18A is typically from about $10^{11}$ to about $10^{15}$ atoms/cm$^2$, with a concentration of dopant within the delta doped region 18A from about $10^{11}$ to about $10^{13}$ atoms/cm$^2$ being even more typical.

The semiconductor substrate 10 employed in the present invention includes any semiconductor material including, for example, Si, SiGe, SiGeC, SiC, Ge alloys, Ga, GaAs, InAs, InP, Ge and all other III-V compound semiconductors. The semiconductor substrate 10 may comprise a layered semiconductor material such as, for example, a semiconductor-on-insulator. The semiconductor substrate 10 may be doped, undoped or contain doped and undoped regions therein. The semiconductor substrate 10 may have a single crystal orientation or it may have surface regions that have different crystal orientations. The semiconductor substrate 10 may be strained, unstrained or a combination thereof.

Figure 4:
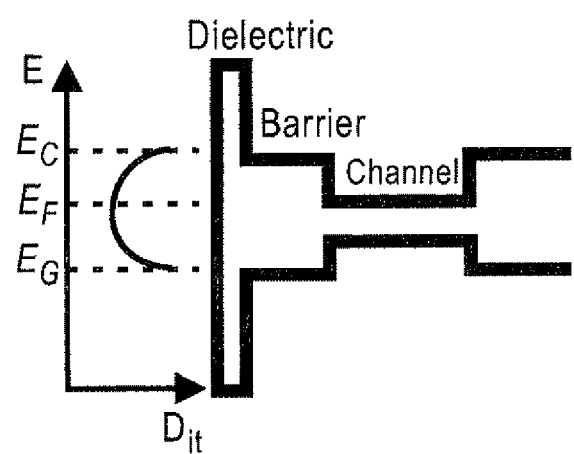
FIG. 4 is an energy band gap diagram and interface state density distribution corresponding to the structure of FIG. 3 in the gate region.

In accordance with the present invention, the band gap of the barrier layer (i.e., the third band gap) is larger (wider) than the band gap of the channel layer (i.e., the second band gap). As stated above, the term "band gap" refers to the energy difference between the top of the valence band (i.e., $E_V$) and the bottom of the conduction band (i.e., $E_C$). Typically, the barrier layer 18 is comprised of a III-V compound semiconductor having a band gap value that is from about 0.5 to about 10 times larger than the band gap of the III-V compound semiconductor material used in the channel layer 16. More typically, the barrier layer 18 is comprised of a III-V compound semiconductor having a band gap value that is from about 1 to about 5 times larger than the band gap of the III-V compound semiconductor material used in the channel layer 16. FIG. 4 shows a typical band diagram of a MOSFET including the inventive heterostructure shown in FIG. 2. In the band diagram $E_C$ and $E_V$ are as defined above, $E_F$ represents the Fermi level and $D_{it}$ represents the interface state density.

The band gap of the buffer layer 14 (i.e., the first band gap) is also larger than that of the channel layer 16; this also helps to confine the electrons within the channel layer as well. Typically, the buffer layer 14 is comprised of a III-V compound semiconductor having a band gap value that is from about 0.5 to about 10 times larger than the band gap of the III-V compound semiconductor material used in the channel layer 16. More typically, the buffer layer 14 is comprised of a III-V compound semiconductor having a band gap value that is from about 1 to about 5 times larger than the band gap of the III-V compound semiconductor material used in the channel layer 16.

It is noted that the band gap of the buffer layer and the band gap of the barrier layer, which are larger than the band gap of the channel layer, do not necessarily have the same value.

Since wide band gap materials are used for the barrier layer (and the buffer layer as well) and a narrow band gap material is used for the channel layer, carriers are confined to the channel layer under certain gate bias range. Typically, the carriers are confined in the channel layer when typical gate bias conditions are applied.

In a preferred embodiment of the present invention, the barrier layer 18 and the buffer layer 14 are comprised of an alloy of InAlAs, while the channel layer 16 is comprised of an alloy of InGaAs. By "alloy of InAlAs" it is meant a composition of $In_xAl_{1-x}As$ wherein x is from about 0 to about 1, and more preferably from about 0.4 to about 0.6. In one highly preferred embodiment of the present x is 0.52. By "alloy of InGaAs" it is meant a composition of $In_yGa_{1-y}As$ wherein y is from about 0 to about 1, and more preferably y is from about 0.3 to about 0.8. In an even highly preferred embodiment of the present invention, y is 0.7.

$In_{0.52}Al_{0.48}As$ is an ideal high band gap material for the barrier layer 18 since it has low electron affinity, about 4.03 eV, and it results in a high conduction band offset relative to the channel layer 16. A high barrier for electrons between the barrier layer 18 and the channel 16 is achieved by using $In_{0.7}Ga_{0.3}As$ as the low band gap material for the channel layer 16. $In_{0.7}Ga_{0.3}As$ channel can have electron mobility of greater than 10,000 cm$^2$/Vs at room temperature. In addition, $In_{0.7}Ga_{0.3}As$ has a higher electron affinity, 4.65 eV, than that of $In_{0.52}Al_{0.48}As$ which can further increase the conduction band offset. However, oxidation of InAlAs poses a challenge which needs to be addressed via proper surface passivation prior to gate dielectric deposition.

It is noted that each of the III-V compound semiconductor layers employed in the present invention is a single crystal material of typical commercial quality. By "typical commercial quality" it is meant that each of the III-V compound semiconductor layers have a defect density on the order of about 10$^5$ atoms/cm$^2$ or less, with a defect density of less than about 5000 atoms/cm$^2$ being more typical. The typical commercial quality of the III-V compound semiconductor layers is a result of utilizing an epitaxial growth process such as, for example, molecular beam epitaxy (MBE) or metalorgano chemical vapor deposition (MOCVD). That is, each of the III-V compound semiconductor layers are formed by an epitaxial growth process that produces a high quality, single crystal III-V film. The deposition of each of the III-V compound semiconductor layers of the preset invention may be performed in the same or different apparatus. Moreover, each of the III-V compound semiconductor layers can be formed without breaking vacuum during the deposition of each of the layers. Alternatively, vacuum may be broken during the formation of an individual III-V compound semiconductor layer.

The III-V compound semiconductors are epitaxially grown utilizing III/V-containing precursors that are well known to those skilled in the art. When the vacuum between the deposition of each of the III-V layers is not broken, the precursors can be switched to provide the next layer. In some embodiments, a graded III-V compound semiconductor layer can be formed.

When a delta doped region 18A is formed into the lower region of the barrier layer 18A, an in-situ doping deposition process can be used in which the dopant atom is introduced during the initial formation of the barrier layer and following the formation of a desired thickness of the delta doped region (typically on the order of about 0.1 to about 2.0 nm), the dopant is removed from the precursor stream and the barrier layer 18 formation continues. Alternatively, the delta doped region 18A can be formed utilizing ion implantation after the barrier layer 18 has been formed. The conditions of such an implant are selected to provide a delta doped region next to, but not in contact with, the interface of the underlying channel layer 16.

Each of the individual III-V compound semiconductor layers shown in FIG. 1 are thin (providing a total thickness of less than 600 nm). Typically, the buffer layer 14 has a thickness from about 25 to about 500 nm, with a thickness from about 100 to about 300 nm being even more typical. The channel layer 16 of the inventive structure has a thickness from about 1 to about 15 nm, with a thickness from about 5 to about 10 nm being even more typical. The thickness of the barrier layer 18 of the inventive structure is from about 0.1 to about 10 nm, with a thickness from about 0.5 to about 10 nm being even more typical.

The applicants have formed a functional buried channel $In_{0.7}Ga_{0.3}As$ MOSFETs with a $HfO_2$ gate dielectric using a structure similar to that in FIG. 1, and have shown that these devices operate with much reduced gate leakage compared to Schottky-gated devices. Extracted drift mobility of 6600 $cm^2$/V-s, at an apparent carrier density of $3.2 \times 10^{12}$ $cm^{-2}$ was obtained.

Figure 2:
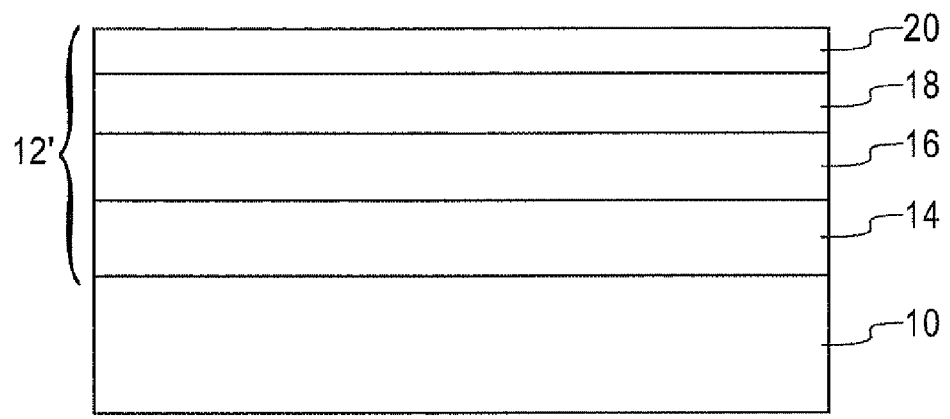
FIG. 2 is a pictorial representation (through a cross sectional view) illustrating another heterostructure of the present invention which is suitable for used in a buried-channel MOSFET; this heterostructure represents a highly preferred embodiment.

Reference is now made to FIG. 2 which illustrates a preferred heterostructure 12' that is formed atop a semiconductor substrate 10. The preferred heterostructure 12' comprises a buffer layer 14, a channel layer 16, a non-doped barrier layer 18 and a III-V compound semiconductor cap layer 20.

The III-V semiconductor cap layer 20 is typically, but not always necessarily, a doped layer. The dopant within the III-V compound semiconductor cap layer 20 can be an n-type dopant or a p-type dopant, with an n-type dopant being more typical for an MOSFET. Unlike the delta doped region 18A described above, the doping within the cap layer 20 is evenly distributed throughout the entire vertical thickness of the layer. The concentration of dopant with the cap layer 20 is typically from about $10^{17}$ to about $10^{21}$ atoms/$cm^3$, with a concentration of dopant within the cap layer from about $10^{18}$ to about $10^{20}$ atoms/$cm^3$ being more typical.

The cap layer 20 may comprise the same or different III-V compound semiconductor as the channel layer 16. In a preferred embodiment of the present invention, the cap layer 20 comprises the same III-V compound semiconductor elements, but different alloy composition, as the channel layer 16 except for the presence of dopants within the cap layer 20.

The cap layer 20 is also a single crystal material of typical commercial quality since an epitaxial growth process such as MBE or MOCVD is used in forming the same. The doping of the cap layer 20 typically occurs during the deposition of the cap layer. Alternatively, the dopants can be introduced into the cap layer 20 post deposition by ion implantation or out-diffusion from a doped layer that is formed atop the cap layer 20.

The thickness of the cap layer 20 is from about 5 to about 50 nm, with a thickness from about 15 to about 30 nm being even more typical.

In a preferred embodiment of the heterostructure 12' shown in FIG. 2, the barrier layer 18 and the buffer layer 14 are comprised of an alloy of InAlAs, while the channel layer 16 and the cap layer 20 are comprised of an alloy of InGaAs. The cap layer 20 is heavily doped with an n-type dopant. By "alloy of InAlAs" it is meant a composition of $In_xAl_{1-x}As$ wherein x is from about 0 to about 1, and more preferably from about 0.4 to about 0.6. In one highly preferred embodiment of the present x is 0.52. By "alloy of InGaAs" it is meant a composition of $In_yGa_{1-y}As$ wherein y is from about 0 to about 1, and more preferably y is from about 0.3 to about 0.8. In a highly preferred embodiment of the present invention, y is 0.7.

Figure 3:
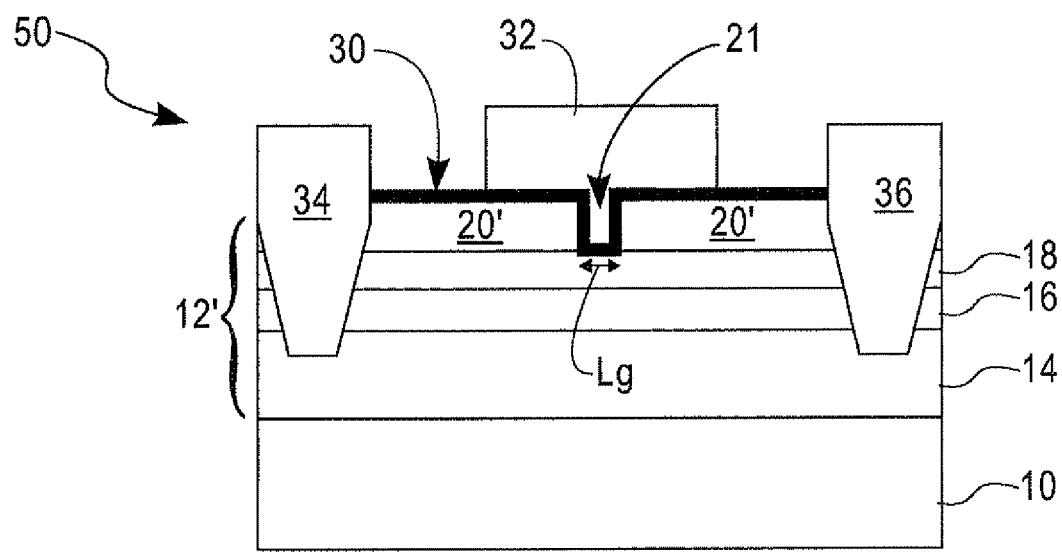
FIG. 3 is a pictorial representation (through a cross sectional view) illustrating a buried channel MOSFET using the heterostructure shown in FIG. 2

Reference is now made to FIG. 3 which illustrates a FET (i.e., MOSFET) structure of the present invention including the heterostructure 12' shown in FIG. 2 (with the cap layer patterned into patterned cap layer 20' having at least one opening 21) atop semiconductor substrate 10. It is emphasized that although the FET shown in FIG. 3 includes the heterostructure 12' of FIG. 2, the present invention also contemplates a FET in which the heterostructure 12 of FIG. 1 is used. When the heterostructure 12 shown in FIG. 1 is employed, the dielectric material (to be described herein below) is directly present on an upper surface of the barrier layer 18.

The FET 50 shown in FIG. 3 includes a semiconductor substrate 10 as described above, a heterostructure 12' as described above including a patterned cap layer 20 having an opening 21 that exposes a surface of the barrier layer 18, located on an upper surface of the semiconductor substrate 10, a dielectric material 30 located on the upper surface of the patterned cap layer 20 as well as within the opening 21 covering the sidewalls of the patterned cap layer 20' and the exposed surface of the barrier layer 18, a gate conductor 32 located on a portion of said dielectric material 30 and above said opening 21, and source contact 34 and a drain contact 36 abutting the outer edges of the dielectric material 30 and extending into at least the channel layer 16; in the drawing the source/drain contacts (34, 36) extend into the buffer layer 14.

In FIG. 3, $L_g$ denotes the gate length which is defined by the distance of the remaining cap layer 20' extending from the opening 21 to either the source or drain contact (34, 36). In one embodiment, the channel length is less than or equal to 260 nm. In some embodiments, the structure has a positive threshold voltage.

The dielectric material 30 employed in the present invention has a dielectric constant of greater than 4.0; such a dielectric material is referred to hereafter as a high k dielectric. Typically, the high k dielectric 30 has a dielectric constant of about 7.0 or greater, with a dielectric constant of about 10.0 or greater being even more typical. The dielectric constants mentioned herein are relative to a vacuum, unless otherwise stated. Specifically, the high k dielectric 30 employed in the present invention includes, but is not limited to an oxide, nitride, oxynitride and/or silicates including metal silicates, aluminates, titanates and nitrides. In one embodiment, it is preferred that the high k dielectric 30 is comprised of $HfO_2$, $ZrO_2$, $Al_2O_3$, $TiO_2$, $La_2O_3$, $SrTiO_3$, $LaAlO_3$, $Y_2O_3$, a pervoskite oxide, $HfSiO_x$, $HfAlO_x$ or $HfAlO_aN_b$. Preferably, the high k dielectric 30 is a Hf-based dielectric material.

The high k dielectric 30 is formed utilizing a conventional deposition process including, but not limited to molecular beam epitaxy (MBE), chemical vapor deposition (CVD), plasma enhanced chemical vapor deposition (PECVD), atomic layer deposition (ALD), evaporation, physical vapor deposition (PVD), chemical solution deposition and other like deposition processes.

The thickness of the high k dielectric 30 may vary depending on the deposition technique employed in fabricating the same as well as the composition and number of dielectrics of the high k dielectric. Typically, the high k dielectric 30 has a thickness from about 0.5 to about 20 nm, with a thickness from about 1 to about 10 nm being highly preferred.

The gate conductor 32 of the present invention includes any conductive material such as, for example, polysilicon, polysilicon germanium, conductive metals, conductive metal alloys, conductive silicides, conductive nitrides and combinations or multilayers thereof. When metallic-containing gate conductors are employed, the metallic gate conductor can be doped so as to shift the workfunction of the gate conductor. Illustrative examples of dopant ions include As, P, B, Sb, Bi, Al, Ga, Ti or mixtures thereof. The same dopants are also used with polysilicon or polySiGe mentioned above. Preferably, the gate conductor 32 is a conductive metal, with Al, Pt, Au, W and Ti being highly preferred. The selection of metal gates is advantageous since conductive metals have different workfunctions that permit one to adjust the threshold voltage of the device.

The gate conductor 32 is formed by a conventional deposition process such as, for example, CVD, PECVD, PVD, plating, thermal or ebeam evaporation and sputtering. The gate conductor may be patterned by lithography and etching. Alternatively, the gate conductor 32 is formed by a conventional lift-off process.

The source and drain contacts (34, 36), which are on either side of the gate conductor 32, are typically comprised of a conductive material including one of the conductive materials mentioned above for the gate conductor 32. The contacts are formed by lithography, etching a trench into the gate dielectric 30 and filling the trench with a conductive material.

In some embodiments of the present invention, the barrier layer 18 may include a thin passivation layer (not shown). When present, the thin passivation layer may comprise a thin layer of a chemical oxide. Alternatively, the passivation layer may include a thin layer of amorphous $Si/SiO_2$ or $Ge/Si/SiO_2$. The thin passivation layer has a thickness from about 0.5 to about 30 nm.

The optional passivation layer is formed by cleaning the surface of the barrier layer 18 to remove any residual layers (e.g., native oxides), foreign particles, and any residual metallic surface contamination and to temporarily clean the barrier surface. Any residual oxide is removed in a solution of hydrofluoric acid, for example. Other wet etching solutions can also be used to form the optional passivation layer. Alternatively, treatment with a hydrogen plasma alone, or in conjunction with a chemical wet etchant may also be used to form the optional passivation layer.

In some embodiment, the dielectric material 30 not protected by the gate conductor 32 can be removed and a selective epitaxial semiconductor layer can be formed adjacent the gate conductor to provides raised source/drain regions that lower the source/drain series resistance. Examples of selective epitaxial semiconductor layers that can be used include, but are not limited to InGaAs having an In content that varies from 40 to 80% or Ge.

In the following example, an undoped $In_{0.7}Ga_{0.3}As/In_{0.52}Al_{0.48}As$ quantum well layer structure was used as shown in FIG. 2. The layer structure was grown on an InP substrate, and consisted of a 300 nm $In_{0.52}Al_{0.48}As$ buffer layer, a 10 nm strained $In_{0.7}Ga_{0.3}As$ channel, a 10 nm $In_{0.52}Al_{0.48}As$ top barrier layer and a 25 nm n+-$In_{0.53}Ga_{0.47}As$ cap layer. Aside from the top $In_{0.53}Ga_{0.47}As$ layer which was etched away in the gate region; all layers were not-intentionally doped.

Device Fabrication

Long and short channel MOSFETs with metal gates and high k dielectrics were fabricated using the above layer structure. Long-channel ring FET devices were made by patterning the heterostructure using optical lithography followed by selectively etching the InGaAs cap layer to form a gate recess area. After gate dielectric deposition, Ohmic contacts (i.e., source/drain contacts) were then formed. The gate regions were then defined by optical lithography and metal lift off. The short-channel device fabrication included an additional mesa isolation step before the gate lithography. In addition, the gate recess was patterned by electron-beam lithography, where gate lengths as short as 260 nm were fabricated. The long-channel devices utilized MBE-deposited $HfO_2$ and had Al gates, while the short-channel devices had ALD-$Al_2O_3$ as a gate dielectric and Al or Pt as the gate conductors.

Long-Channel MOSFETs

Figure 7:
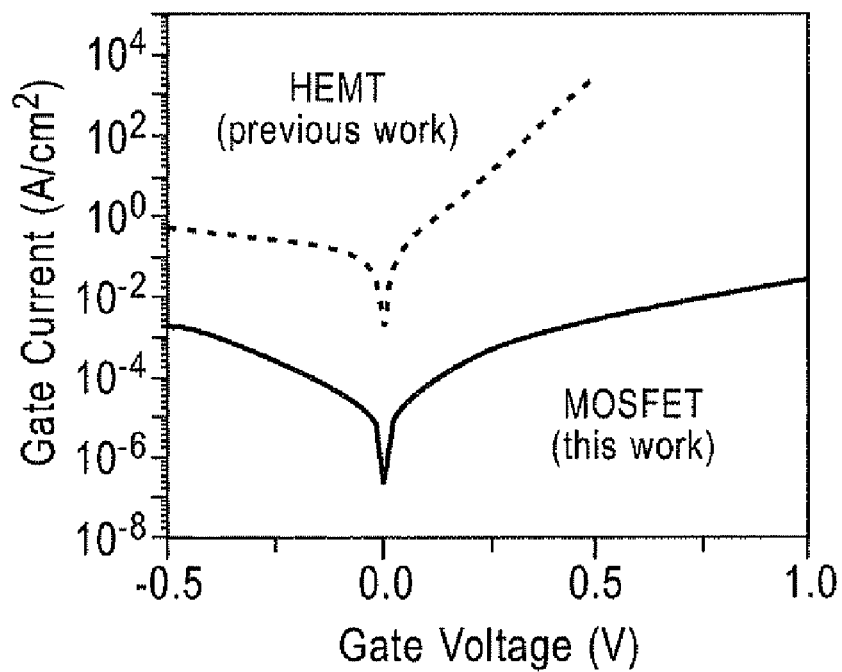
FIG. 7 is a plot of gate current ($A/cm^2$) vs. gate voltage (V) of a long channel MOSFET ($L_g$=5 microns) with a prior art HEMT device.
Figure 8:
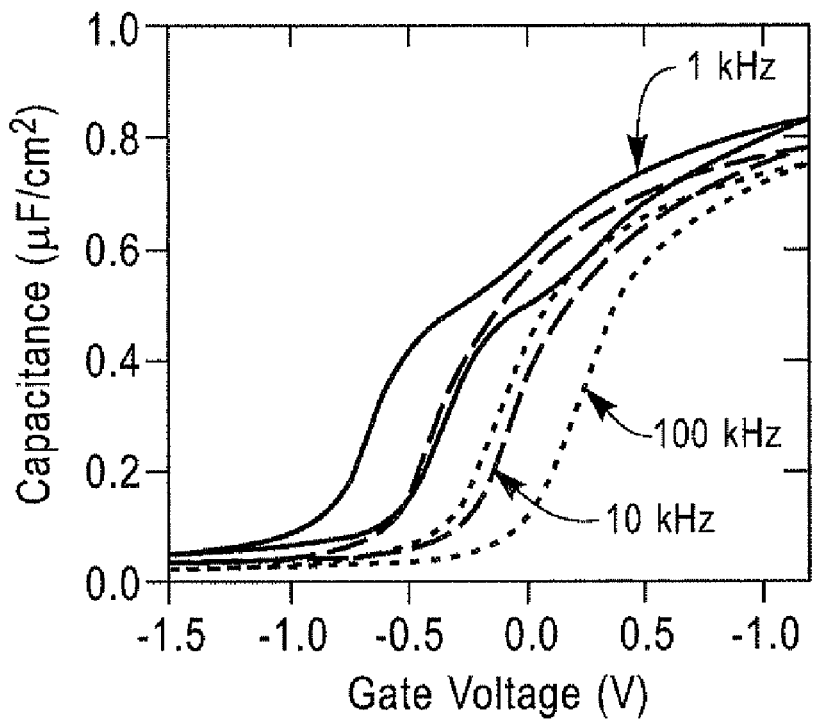
FIG. 8 is a plot of capacitance ($\mu F/cm^2$) vs. gate voltage (V) of an inventive buried channel MOSFET.
Figure 9:
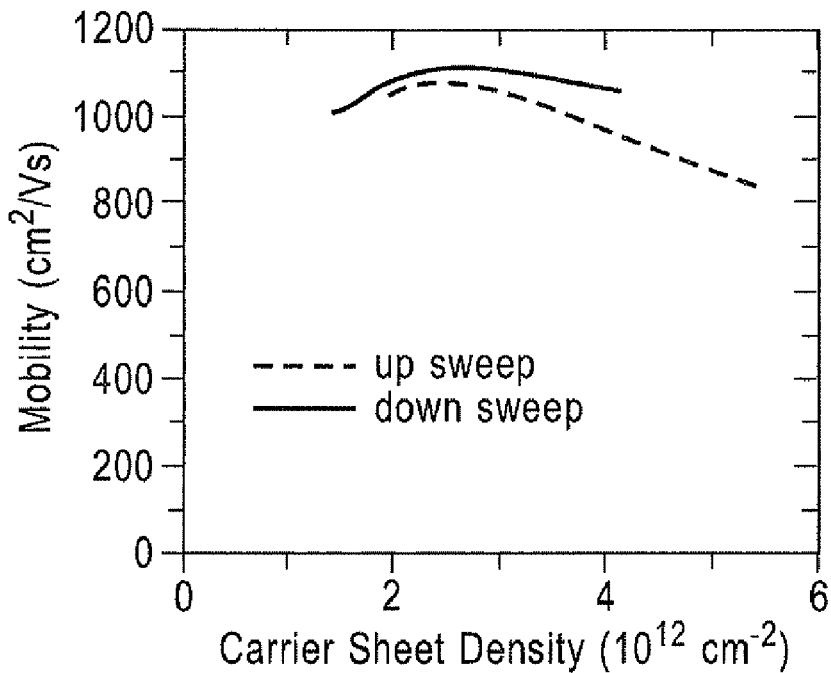
FIG. 9 is a plot of mobility ($cm^2/Vs$) vs. carrier sheet density ($10^{12} cm^{-2}$) of an inventive buried channel MOSFET using 100 khz C-V data.

The DC output characteristics of a typical buried $In_{0.7}Ga_{0.3}As$ channel MOSFET with Lg=5 μm are shown in FIG. 5. The devices showed good saturation and pinch off characteristics. A series resistance of 128Ω was observed despite, the long channel length, an issue that may, in part, be due to non-optimized contact formation. The sub-threshold characteristics and corresponding transconductance are shown in FIGS. 6A-6B. The devices operate in enhancement mode and had a threshold voltage of 0.25 V, as determined by linear extrapolation from the peak transconductance at Vds=50 mV. The drain current on-off ratio was approximately $10^4$, and the devices had a sub-threshold slope of 150 mV/decade. The extrinsic transconductance, $g_{mext}$, had a peak value of 23 mS/mm at Vds=1.2 V. The gate leakage characteristics are shown in FIG. 7, and were compared with prior art HEMTs. The gate leakage current density of the MOSFET was more than 200× lower than the Schottky-gated devices. The capacitance-voltage results for the MOSFETs are shown in FIG. 8. The effective-oxide thickness (EOT) extracted from the data was 4.4+0.3 nm. The interface state density for these device was in the high $10^{12}$ $cm^{-2}/eV$ range, and this value could account for the non-ideal sub-threshold slope. After correcting for the series resistance, the effective drift mobility and the sheet density were calculated from the Cg vs. Vgs (100 kHz) and linear Id–Vgs characteristics (Vds=50 mV). The resulting mobility vs. sheet density plot is shown in FIG. 9. A peak mobility of 1100 $cm^2$/Vs was determined at a carrier density of $2.6×10^{12}$ $cm^{-2}$. Further improvements should be possible through optimization of the interface properties.

Short-Channel MOSFETs

Figure 10:
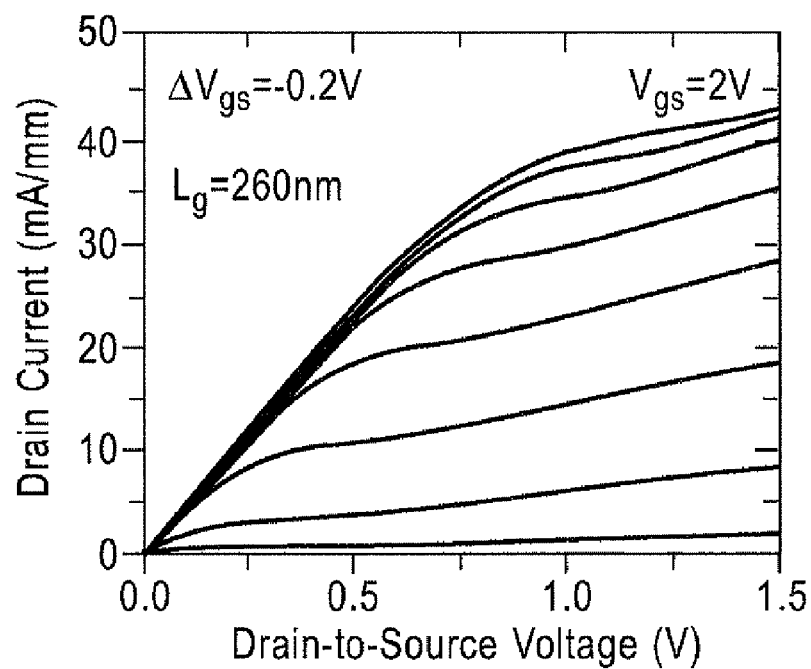
FIG. 10 is a plot of drain current (mAmps/mm) vs. drain-to-source voltage (V) of a short channel MOSFET with $L_g$=260 nm.
Figure 11:
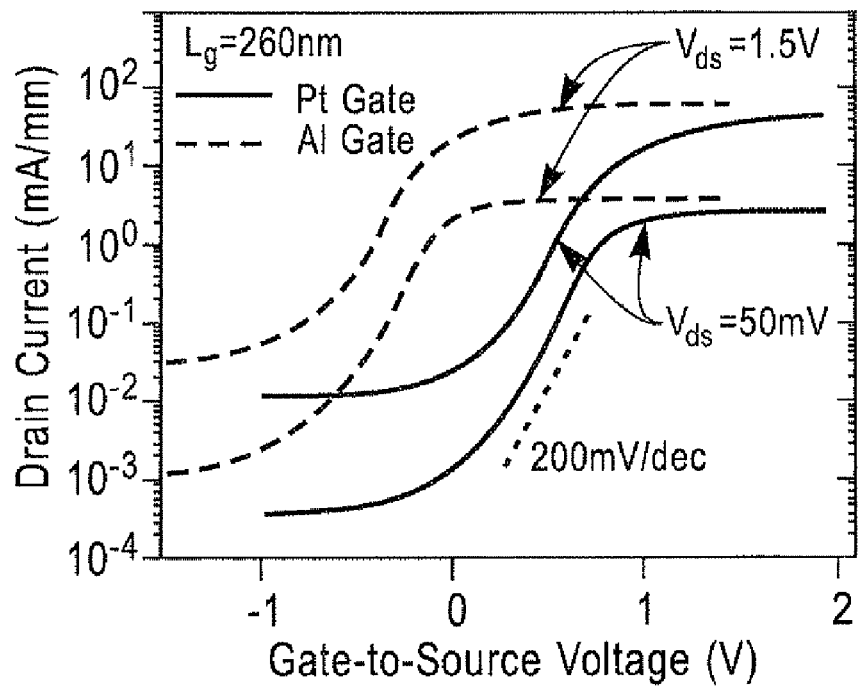
FIG. 11 is a plot of drain current (mAmps/mm) vs. drain-to-source voltage (V) of a short channel MOSFET with $L_g$=260 nm of a enhancement mode (EM) and a depletion mode (DM) short channel MOSFET with $L_g$=260 nm.
Figure 12:
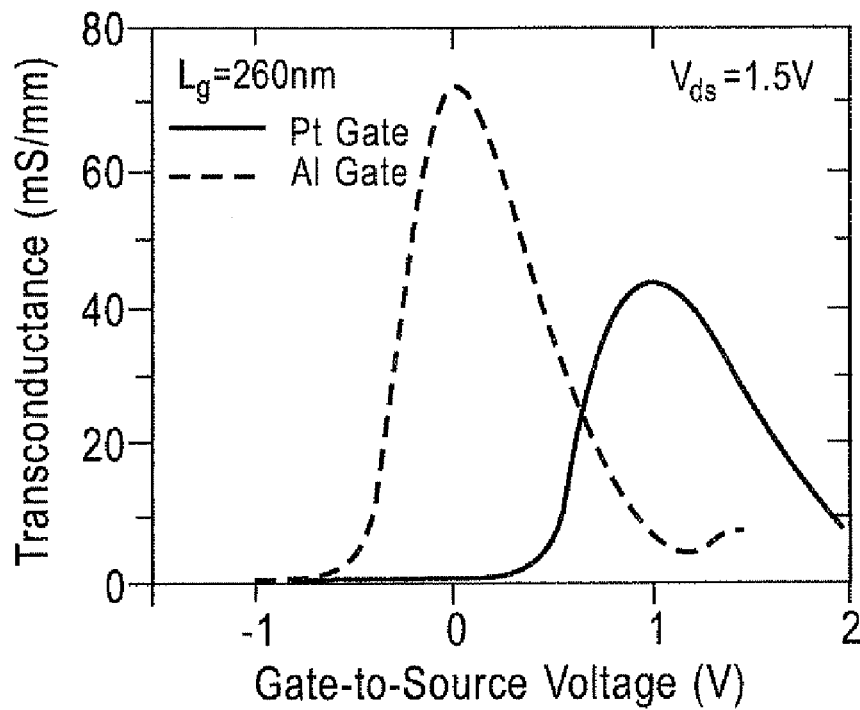
FIG. 12. is a plot of transconductance (mS/mm) vs. gate-to-source (V) of a short channel MOSFET with $L_g$=260 nm.
Figure 13:
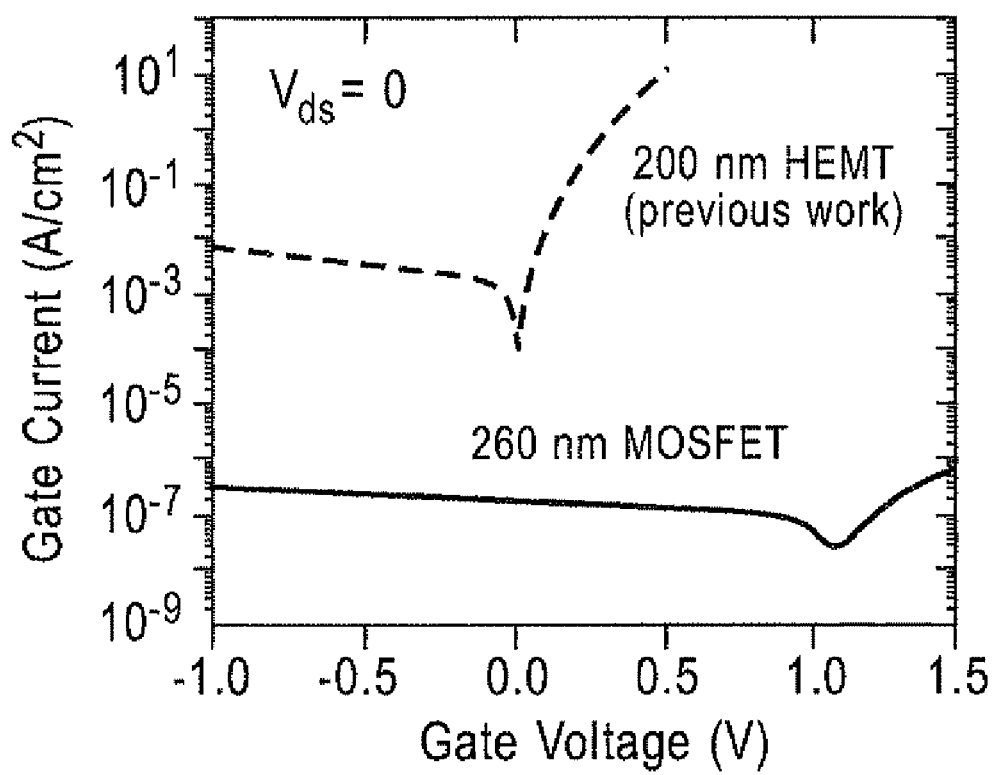
FIG. 13 is a plot of gate current (mAmps/m) vs. gate voltage (V) comparing the gate leakage characteristics of a 260 nm MOSFET with a 200 nm prior art HEMT.

As shown in FIG. 10, the short-channel MOSFETs (Lg=260 nm) had good saturation characteristics, but had high series resistance due to long access regions and non-ideal contacts. Depending upon the gate metal utilized, the devices were made to operate in both enhancement mode (Vt=+0.5 V), and depletion mode (Vt=−0.2 V), as shown in FIGS. 11 and 12. The enhancement-mode devices had on-off ratio of approximately $10^3$ at Vds=50 mV, and sub threshold slope of approximately 200 mV/dec (See, FIG. 11). For these devices, $g_{mext}$, had a peak value of 43 mS/mm at Vds=1.2 V. The gate leakage as in FIG. 13 shows considerable improvement over previous HEMT devices.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor heterostructure comprising:
a III-V compound semiconductor buffer layer having a first band gap;
a III-V compound semiconductor channel layer having a second band gap located on an upper surface of said buffer layer;
a III-V compound semiconductor barrier layer having a third band gap located on an upper surface of the III-V compound semiconductor channel layer, wherein said III-V compound semiconductor barrier layer includes a doped region which is located in a lower region of said III-V compound semiconductor barrier layer but is not in direct contact with an interface with the III-V compound semiconductor channel layer, wherein said first and third band gaps are larger than the second band gap;
a III-V compound semiconductor cap layer located atop the III-V compound semiconductor barrier layer having an opening providing an exposed portion of the III-V compound semiconductor barrier layer;
a dielectric material having a dielectric constant of greater than 4.0 located on sidewalls of said opening, the exposed portion of the III-V compound semiconductor barrier layer and on an upper surface of said III-V compound semiconductor cap layer;
a gate conductor located on a portion of said dielectric material filling the opening in the III-V compound semiconductor cap layer; and
a source contact and a drain contact which are in contact with at least said III-V compound semiconductor channel layer.

2. The semiconductor heterostructure of claim 1 wherein said doped region has a dopant concentration from about $10^{11}$ to about $10^{15}$ atoms/cm$^2$.

3. The semiconductor heterostructure of claim 1 wherein said doped region includes an element from Group IV, II or VI or the Periodic Table of Elements as a dopant.

4. The semiconductor heterostructure of claim 1 wherein said cap layer includes an n-type dopant.

5. The semiconductor heterostructure of claim 1 wherein said cap layer comprises the same or different III-V compound semiconductor as the channel layer.

6. The semiconductor heterostructure of claim 1 wherein said barrier layer and said buffer layer are comprised of an alloy of InAlAs, while said channel layer is comprised of an alloy of InGaAs.

7. The semiconductor heterostructure of claim 6 wherein said alloy of InAlAs has the formula $In_xAl_{1-x}As$ wherein x is from about 0.4 to about 0.6, and said alloy of InGaAs has the formula $In_yGa_{1-y}As$ wherein y is from about 0.3 to about 0.8.

8. The semiconductor heterostructure of claim 6 wherein said alloy of InAlAs is $In_{0.52}Al_{0.48}As$ and said alloy of InGaAs is $In_{0.7}Ga_{0.3}As$.

9. The semiconductor heterostructure of claim 1 wherein each of said III-V compound semiconductor layers is a single crystal material having a defect density on the order of about $10^5$ atoms/cm$^2$ or less.

10. The semiconductor heterostructure of claim 1 wherein said buffer layer has a thickness from about 25 to about 500 nm, said channel layer has a thickness from about 1 to about 15 nm and said barrier layer has a thickness from about 0.1 to about 10 nm.

11. A semiconductor structure comprising:
a semiconductor substrate having an upper surface;
a buried channel structure located on said upper surface of said semiconductor substrate, wherein said buried channel structure comprises a III-V compound semiconductor buffer layer having a first band gap located atop said upper surface of said semiconductor substrate, a III-V compound semiconductor channel layer having a second band gap located on said buffer layer, and a III-V compound semiconductor barrier layer having a third band gap located on an upper surface of the III-V compound semiconductor channel layer, wherein said III-V compound semiconductor barrier layer includes a doped region that is located in a lower region of said III-V compound semiconductor barrier layer but is not in direct contact with an interface with the III-V compound semiconductor channel layer, wherein said first and third band gaps are larger than the second band gap;
a dielectric material having a dielectric constant of greater than 4.0 located on said buried channel structure and in contact with at least a portion of said barrier layer;
a gate conductor located on a portion of said dielectric material; and
a source contact and a drain contact which are in direct contact with at least said III-V compound semiconductor buffer layer, said III-V compound semiconductor channel layer, and said III-V compound semiconductor barrier layer.

12. The semiconductor structure of claim 11 wherein said doped region has a dopant concentration from about $10^{11}$ to about $10^{15}$ atoms/cm$^2$.

13. The semiconductor structure of claim 11 wherein said doped region includes an element from Group IV, II or VI or the Periodic Table of Elements as a dopant.

14. The semiconductor structure of claim 13 wherein said barrier layer and said buffer layer are comprised of an alloy of InAlAs, while said channel layer is comprised of an alloy of InGaAs.

15. The semiconductor structure of claim 14 wherein said alloy of InAlAs has the formula $In_xAl_{1-x}As$ wherein x is from about 0.4 to about 0.6, and said alloy of InGaAs has the formula $In_yGa_{1-y}As$ wherein y is from about 0.3 to about 0.8.

16. The semiconductor structure of claim 14 wherein said alloy of InAlAs is $In_{0.52}Al_{0.48}As$ and said alloy of InGaAs is $In_{0.7}Ga_{0.3}As$.

17. The semiconductor structure of claim 11 further comprising a patterned III-V compound semiconductor cap layer located atop the III-V compound semiconductor barrier layer, said patterned cap layer having an opening that exposes said barrier layer.

18. The semiconductor structure of claim 17 wherein said patterned cap layer includes an n-type dopant.

19. The semiconductor structure of claim 17 wherein said patterned cap layer is doped with a dopant, said dopant is present within said cap layer in a concentration from about $10^{17}$ to about $10^{21}$ atoms/cm$^3$.

20. The semiconductor structure of claim 17 wherein said patterned cap layer comprises the same or different III-V compound semiconductor as the channel layer.

21. The semiconductor structure of claim 11 wherein each of said III-V compound semiconductor layers is a single crystal material having a defect density on the order of about $10^5$ atoms/cm$^2$ or less.

22. The semiconductor structure of claim 11 wherein said buffer layer has a thickness from about 25 to about 500 nm, said channel layer has a thickness from about 1 to about 15 nm and said barrier layer has a thickness from about 0.1 to about 10 nm.

23. The semiconductor structure of claim 11 wherein said dielectric material comprises $HfO_2$, $ZrO_2$, $Al_2O_3$, $TiO_2$, $La_2O_3$, $SrTiO_3$, $LaAlO_3$, $Y_2O_3$, a pervoskite oxide, $HfSiO_z$, $HfAlO_z$ or $HfAlO_aN_b$.

24. The semiconductor structure of claim 11 wherein said gate conductor comprises polysilicon, polysilicon germanium, a conductive metal, a conductive metal alloy, a conductive silicide, a conductive nitride or combinations and multilayers thereof.

25. The semiconductor structure of claim 11 wherein said source contact and said drain contact comprise polysilicon, polysilicon germanium, a conductive metal, a conductive metal alloy, a conductive silicide, a conductive nitride and combinations or multilayers thereof.

26. The semiconductor structure of claim 11 wherein said structure has a positive threshold voltage and having a gate length of less than or equal to 260 nm.

27. A method of fabricating a III-V compound semiconductor-containing heterostructure comprising:
  first epitaxially growing a III-V compound semiconductor buffer layer having a first band gap on an upper surface of a substrate;
  second epitaxially growing a III-V compound semiconductor channel layer having a second band gap on an upper surface of said buffer layer;
  third epitaxially growing a III-V compound semiconductor barrier layer having a third band gap on an upper surface of the III-V compound semiconductor channel layer, wherein said III-V compound semiconductor barrier layer includes a doped region that is located in a lower region of said III-V compound semiconductor barrier layer but is not in direct contact with an interface with the III-V compound semiconductor channel layer, in which said first and third band gaps are larger than the second band gap;
  fourth epitaxially growing a III-V compound semiconductor cap layer on the surface of the III-V compound semiconductor barrier layer;
  forming an opening through the III-V compound semiconductor cap layer to provide an exposed portion of the III-V compound semiconductor barrier layer;
  forming a dielectric material having a dielectric constant of greater than 4.0 in direct contact with the III-V compound semiconductor barrier layer and in contact with sidewalls of the opening and at least a portion of an upper surface of said III-V compound semiconductor cap layer; and
  forming a gate conductor on the dielectric material filling at least the opening.

28. A method of fabricating a FET comprising:
  forming a buried channel structure located on an upper surface of a semiconductor substrate, wherein said forming comprises first epitaxially growing a III-V compound semiconductor buffer layer having a first band gap on a said upper surface of said substrate, second epitaxially growing a III-V compound semiconductor channel layer having a second band gap on an upper surface of said buffer layer, and third epitaxially growing a III-V compound semiconductor barrier layer having a third band gap on an upper surface of the channel layer, wherein said III-V compound semiconductor barrier layer includes a doped region that is located in a lower region of said III-V compound semiconductor barrier layer but is not in direct contact with an interface with the III-V compound semiconductor channel layer, in which said first and third band gaps are larger than the second band gap;
  forming a dielectric material having a dielectric constant of greater than 4.0 located on said buried channel structure and in contact with at least a portion of said barrier layer;
  forming a gate conductor located on a portion of said dielectric material; and
  forming a source contact and a drain contact which are in direct contact with at least said III-V compound semiconductor buffer layer, said III-V compound semiconductor channel layer and said III-V compound semiconductor barrier layer.

29. The method of claim 28 further comprising forming a patterned III-V compound semiconductor cap layer having at least one opening that exposes a surface of said barrier layer, said forming comprises a fourth epitaxial growing step, lithography and etching.

* * * * *